United States Patent
Hosoda et al.

(10) Patent No.: US 7,018,694 B2
(45) Date of Patent: Mar. 28, 2006

(54) OPTICAL RECORDING MEDIUM, METHOD FOR MANUFACTURING THE SAME AND TARGET USED FOR SPUTTERING PROCESS

(75) Inventors: Yasuo Hosoda, Saitama (JP); Ayumi Mitsumori, Saitama (JP); Megumi Sato, Saitama (JP); Masataka Yamaguchi, Saitama (JP); Tetsuya Iida, Saitama (JP); Hiroyasu Inoue, Tokyo (JP); Koji Mishima, Tokyo (JP); Masaki Aoshima, Tokyo (JP)

(73) Assignees: TDK Corporation, Tokyo (JP); Pioneer Corporation, Tokyo (JP)

(*) Notice: Subject to any disclaimer, the term of this patent is extended or adjusted under 35 U.S.C. 154(b) by 159 days.

(21) Appl. No.: 10/805,727

(22) Filed: Mar. 22, 2004

(65) Prior Publication Data
US 2004/0190435 A1    Sep. 30, 2004

(30) Foreign Application Priority Data
Mar. 24, 2003   (JP) ............................. 2003-080746

(51) Int. Cl.
*B32B 3/02* (2006.01)

(52) U.S. Cl. .................. 428/64.1; 428/64.4; 428/64.5; 430/270.13; 420/548

(58) Field of Classification Search .......... 430/270.13; 428/64.5
See application file for complete search history.

(56) References Cited

U.S. PATENT DOCUMENTS

| | | | |
|---|---|---|---|
| 5,458,941 A | 10/1995 | Hintz | 428/64.4 |
| 5,958,649 A | 9/1999 | Hirotsune et al. | 430/270.13 |
| 6,929,840 B1 * | 8/2005 | Hosoda et al. | 428/64.1 |

FOREIGN PATENT DOCUMENTS

| | | |
|---|---|---|
| JP | 62-204442 | 9/1987 |
| JP | 1-270528 | 10/1989 |
| JP | 7-235465 | 9/1995 |
| JP | 2000-297365 | 10/2000 |

* cited by examiner

Primary Examiner—Elizabeth Mulvaney
(74) Attorney, Agent, or Firm—Seed IP Law Group PLLC

(57) ABSTRACT

An optical recording medium includes a recording layer containing an alloy represented by a general formula: $(Ti_xM1_x)_yM2_y$, where element M1 is Si or Al, element M2 is an element selected from the group consisting of Si, Al and Fe and different from the element M1, x is equal to or larger than 0.3 and equal to or smaller than 0.8, and y is equal to or larger than 0.75 and equal to or smaller than 1.

The thus constituted optical recording medium only places minimal load on the global environment.

18 Claims, 8 Drawing Sheets

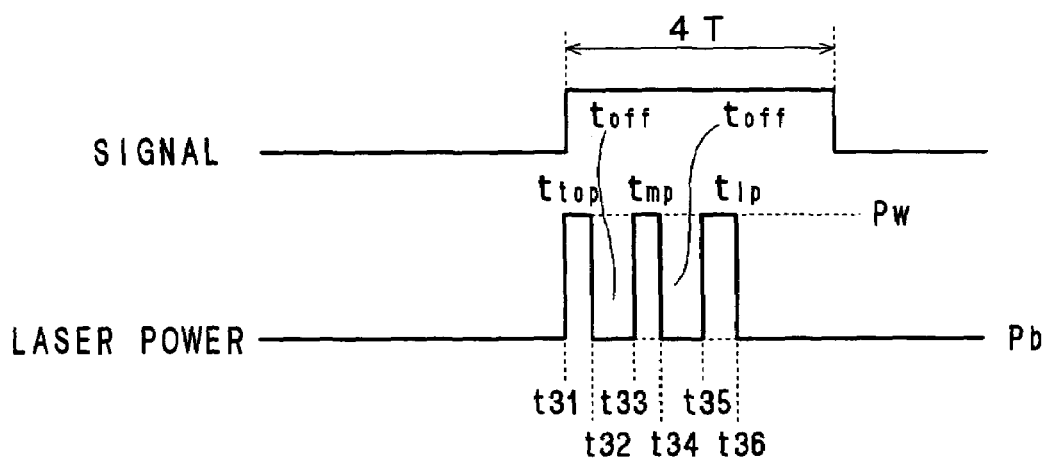
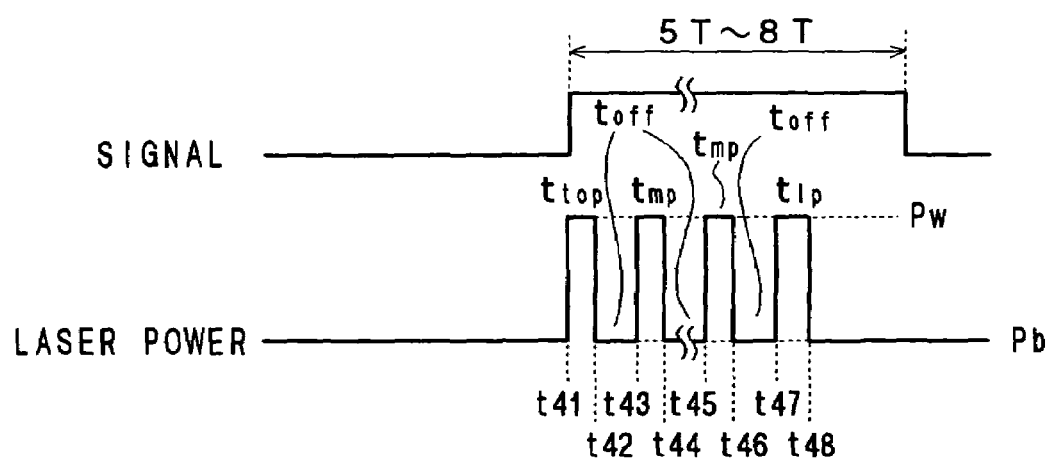

OPTICAL RECORDING MEDIUM, METHOD FOR MANUFACTURING THE SAME AND TARGET USED FOR SPUTTERING PROCESS

BACKGROUND OF THE INVENTION

The present invention relates to an optical recording medium, a method for manufacturing an optical recording medium and a target used for a sputtering process and, particularly, to an optical recording medium including a recording layer formed of materials that place minimal load on the global environment, a method for manufacturing such an optical recording medium, and a target used for a sputtering process that enables a recording layer of an optical recording medium to be formed of materials that place minimal load on the global environment.

DESCRIPTION OF THE PRIOR ART

Optical recording media such as the CD, DVD and the like have been widely used as recording media for recording digital data. These optical recording media can be roughly classified into optical recording media such as the CD-ROM and the DVD-ROM that do not enable writing and rewriting of data (ROM type optical recording media), optical recording media such as the CD-R and DVD-R that enable writing but not rewriting of data (write-once type optical recording media), and optical recording media such as the CD-RW and DVD-RW that enable rewriting of data (data rewritable type optical recording media).

Data are generally recorded in a ROM type optical recording medium using prepits formed in a substrate in the manufacturing process thereof, while in a data rewritable type optical recording medium a phase change material is generally used as the material of the recording layer and data are recorded utilizing changes in an optical characteristic caused by phase change of the phase change material.

On the other hand, in a write-once type optical recording medium, an organic dye such as a cyanine dye, phthalocyanine dye or azo dye is generally used as the material of the recording layer and data are recorded utilizing changes in an optical characteristic caused by chemical change of the organic dye, which change may be accompanied by physical deformation.

Unlike data recorded in a data rewritable type optical recording medium, data recorded in a write-once type optical recording medium cannot be erased and rewritten. This means that data recorded in a write-once type optical recording medium cannot be falsified, so that the write-once type optical recording medium is useful in the case where it is necessary to prevent data recorded in an optical recording medium from being falsified.

However, since an organic dye is degraded when exposed to sunlight or the like, it is difficult to improve long-time storage reliability in the case where an organic dye is used as the material of the recording layer. Therefore, it is desirable for improving long-time storage reliability of the write-once type optical recording medium to form the recording layer of a material other than an organic dye.

As disclosed in Japanese Patent Application Laid Open No. 62-204442, an optical recording medium including two recording layers formed of inorganic materials is known as an example of an optical recording medium whose recording layer is formed of a material other than an organic dye.

However, the inorganic materials for forming recording layers of the optical recording medium disclosed in Japanese Patent Application Laid Open No. 62-204442 include materials which place a heavy load on the environment so that the optical recording medium disclosed in Japanese Patent Application Laid Open No. 62-204442 does not satisfy the requirement for protecting global atmosphere.

SUMMARY OF THE INVENTION

It is therefore an object of the present invention to provide an optical recording medium including a recording layer formed of materials which place minimal load on the global environment.

It is another object of the present invention to provide a method for manufacturing an optical recording medium including a recording layer formed of materials which place minimal load on the global environment.

It is a further object of the present invention is to provide a target lo used for a sputtering process, which can form a recording layer of an optical recording medium of materials which place minimal load on the global environment.

The above and other objects of the present invention can be accomplished by an optical recording medium comprising a recording layer containing an alloy represented by a general formula: $(Ti_xM1_{1-x})_yM2_{1-y}$, where element M1 is Si or Al, element M2 is an element different from the element M1, x is equal to or larger than 0.3 and equal to or smaller than 0.8, and y is equal to or larger than 0.75 and equal to or smaller than 1.

Since each of Ti, Si and Al contained in the recording layer is one of the most commonplace elements on earth and puts only an extremely light load on the global environment, the optical recording medium including a recording layer containing an alloy containing such elements that is provided by the present invention can greatly lower the load placed the global environment.

According to the present invention, when a laser beam is projected onto the recording layer of the optical recording medium, the alloy contained in the recording layer as a primary component is melted at a region of the recording layer irradiated with the laser beam and the phase of the alloy is changed when the melted alloy is solidified, thereby recording data in the recording layer.

In the present invention, it is necessary for x defining the content of Ti and the element M1, namely, Si or Al in the alloy contained in the recording layer, to be equal to or larger than 0.3 and equal to or smaller than 0.8. In a study done by the inventors of the present invention, it was found that in the case where x was smaller than 0.3 or x exceeded 0.8, it was impossible to obtain a reproduced signal having a high C/N ratio and jitter of the reproduced signal and cross-talk of data became worse.

In a further study done by the inventors of the present invention, it was found that the recording characteristic of the optical recording medium improved as the content of the element M2 decreased and when y was equal to 1, in other words when the recording layer consisted of an alloy of Ti and Si or an alloy of Ti and Al, the recording characteristic of the optical recording medium became best.

In the present invention, in order to obtain a reproduced signal having a higher C/N ratio and more effectively suppress cross-talk of data, it is preferable for x to be equal to or larger than 0.4 and equal to or smaller than 0.6 and it is particularly preferable for x to be about 0.5.

In the present invention, it is preferable for the element M2 in the above mentioned general formula to be selected from the group consisting of Si, Al and Fe.

Since each of Si, Al and Fe contained in the alloy as an optional component is one of the most commonplace elements on earth and puts only an extremely light load on the global environment, an optical recording medium including a recording layer containing as a primary component an alloy containing such elements can greatly lower the load placed the global environment.

In a preferred aspect of the present invention, the optical recording medium further comprises a dielectric layer on at least one side of the recording layer.

According to this preferred aspect of the present invention, since the recording layer is physically and chemically protected by the dielectric layer, degradation of recorded data can be effectively prevented over a long period.

In a further preferred aspect of the present invention, the optical recording medium further comprises dielectric layers on opposite sides of the recording layer.

The inventors of the present invention further vigorously pursued a study for accomplishing the above and other objects and, as a result, made the discovery that when a recording layer of an optical recording medium was formed by a sputtering process using a target containing an alloy represented by a general formula: $(Ti_xM1_{1-x'})_{y'}M2_{1-y'}$, where element M1 is Si or Al, element M2 is an element different from the element M1, x' is equal to or lager than 0.37 and equal to or smaller than 0.85 and y' is equal to or lager than 0.75 and equal to or smaller than 1, it was possible to form a recording layer containing an alloy represented by the general formula: $(Ti_xM1_{1-x})_yM2_{1-y}$, where element M1 is Si or Al, element M2 is an element different from the element M1, x is equal to or larger than 0.3 and equal to or smaller than 0.8, and y is equal to or larger than 0.75 and equal to or smaller than 1.

Therefore, the above and other objects of the present invention can be also accomplished by a target used for a sputtering process that contains an alloy represented by a general formula: $(Ti_xM1_{1-x'})_{y'}M2_{1-y'}$, where element M1 is Si or Al, element M2 is an element different from the element M1, x' is equal to or lager than 0.37 and equal to or smaller than 0.85 and y' is equal to or lager than 0.75 and equal to or smaller than 1.

According to this aspect of the present invention, it is possible to fabricate an optical recording medium which can reproduce a signal having a high C/N ratio and low jitter, can effectively suppress cross-talk of data and has an improved recording sensitivity.

In the present invention, it is preferable for the element M2 in the above mentioned general formula to be selected from the group consisting of Si, Al and Fe.

The above and other objects of the present invention can be also accomplished by a method for manufacturing an optical recording medium comprising of a step of forming a recording layer of an optical recording medium by a sputtering process using a target that contains an alloy represented by a general formula: $(Ti_xM1_{1-x'})_{y'}M2_{1-y'}$, where element M1 is Si or Al, element M2 is an element different from the element M1, x' is equal to or lager than 0.37 and equal to or smaller than 0.85 and y' is equal to or lager than 0.75 and equal to or smaller than 1.

According to the present invention, it is possible to fabricate an optical recording medium which can reproduce a signal having a high C/N ratio and low jitter, can effectively suppress cross-talk of data and has an improved recording sensitivity.

The above and other objects and features of the present invention will become apparent from the following description made with reference to the accompanying drawings.

BRIEF DESCRIPTION OF THE DRAWINGS

FIG. 5 is a diagram showing the waveform of a pulse train pattern for modulating the power of a laser beam in the case of recording 4T signals in a recording layer of an optical recording medium shown in FIGS. 1 and 2.

FIG. 6 is a diagram showing the waveform of a pulse pattern for modulating the power of a laser beam in the case of recording one among a 5T signal to an 8T signal in a recording layer of an optical recording medium shown in FIGS. 1 and 2.

DESCRIPTION OF THE PREFERRED EMBODIMENTS

Figure 1:
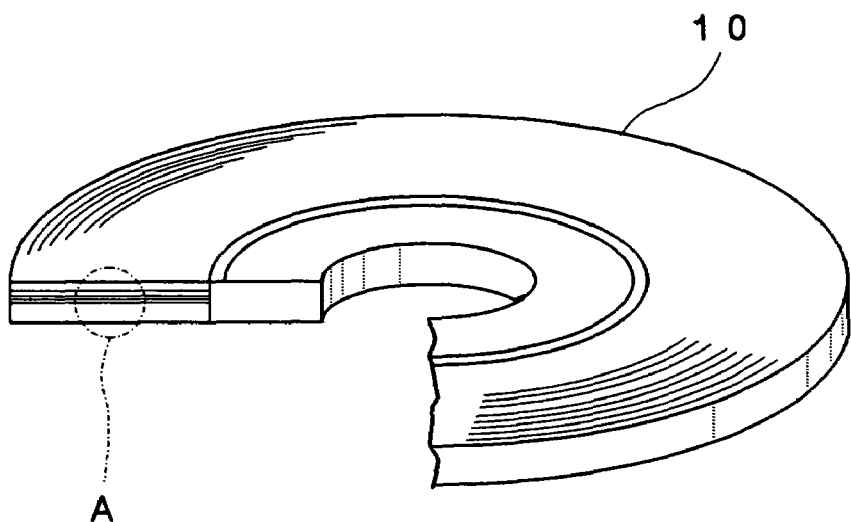
FIG. 1 is a schematic partially cutaway perspective view showing an optical recording medium that is a preferred embodiment of the present invention.
Figure 2:
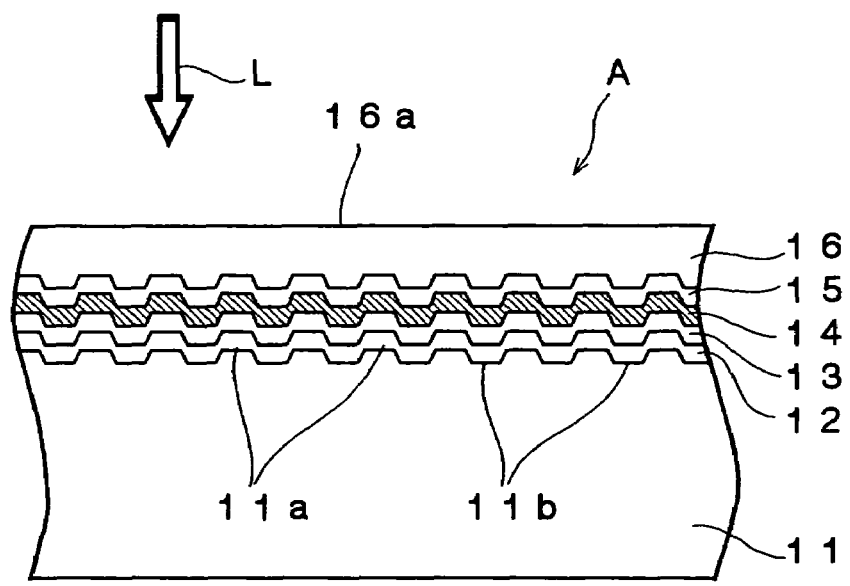
FIG. 2 is an enlarged schematic cross-sectional view of the part of the optical recording medium indicated by A in FIG. 1.

FIG. 1 is a schematic partially cut perspective view showing an optical recording medium that is a preferred embodiment of the present invention and FIG. 2 is a schematic enlarged cross-sectional view indicated by A in FIG. 1.

As shown in FIG. 1, an optical recording medium 10 according to this embodiment is formed disk-like and has an outer diameter of about 120 mm and a thickness of about 1.2 mm.

An optical recording medium 10 according to this embodiment is constituted as a write-once type optical recording medium and as shown in FIG. 2, it includes a support substrate 11, a reflective layer 12 formed on the surface of the support substrate 11, a second dielectric layer 13 formed on the surface of the reflective layer 12, a recording layer 14 formed on the surface of the second dielectric layer 13, a first dielectric layer 15 formed on the surface of the recording layer 14 and a light transmission layer 16 formed on the surface of the first dielectric layer 15.

In this embodiment, as shown in FIG. 2, a laser beam L having a wavelength of 380 nm to 450 nm is projected onto a light incidence plane 16a constituted by one surface of the light transmission layer 16, thereby recording data in the optical recording medium 10 or reproducing data from the optical recording medium 10.

The support substrate 11 serves as a support for ensuring mechanical strength and a thickness of about 1.2 mm required for the optical recording medium 10.

The material used to form the support substrate 11 is not particularly limited insofar as the support substrate 11 can serve as the support of the optical recording medium 10. The support substrate 11 can be formed of glass, ceramic, resin or the like. Among these, resin is preferably used for forming the support substrate 11 since resin can be easily shaped. Illustrative examples of resins suitable for forming the support substrate 11 include polycarbonate resin, polyolefin resin, acrylic resin, epoxy resin, polystyrene resin, polyethylene resin, polypropylene resin, silicone resin, fluoropolymers, acrylonitrile butadiene styrene resin, urethane resin and the like. Among these, polycarbonate resin and polyolefin resin are most preferably used for forming the support substrate 11 from the viewpoint of easy processing, optical characteristics and the like and in this embodiment, the support substrate 11 is formed of polycarbonate resin. In this embodiment, since the laser beam L is projected via the light incident plane 16a located opposite to the support substrate 11, it is unnecessary for the support substrate 11 to have a light transmittance property.

As shown in FIG. 2, grooves 11a and lands 11b are alternately and spirally formed on the surface of the support substrate 11 so as to extend from a portion in the vicinity of the center of the support substrate 11 toward the outer circumference thereof or from the outer circumference of the support substrate 11 toward a portion in the vicinity of the center thereof. The grooves 11a and/or lands 11b serve as a guide track for the laser beam L.

The depth of the groove 11a is not particularly limited and is preferably set to 10 nm to 40 nm. The pitch of the grooves 11a is not particularly limited and is preferably set to 0.2 μm to 0.4 μm.

The reflective layer 12 serves to reflect the laser beam L entering through the light transmission layer 16 so as to emit it from the light transmission layer 16.

The material used to form the reflective layer 12 is not particularly limited insofar as it can reflect a laser beam L, and the reflective layer 12 can be formed of Mg, Al, Ti, Cr, Fe, Co, Ni, Cu, Zn, Ge, Ag, Pt, Au and the like. Among these materials, it is preferable to form the reflective layer 12 of a metal material having a high reflection characteristic, such as Al, Au, Ag, Cu or alloy containing at least one of these metals, such as alloy of Ag and Cu.

The reflective layer 12 also serves to increase the difference in reflection coefficient between a recorded region and an unrecorded region by a multiple interference effect, thereby obtaining a higher reproduced signal (C/N ratio).

The thickness of the reflective layer 12 is not particularly limited but is preferably from 5 nm to 300 nm, more preferably from 20 nm to 200 nm.

In the case where the thickness of the reflective layer 12 is thinner than 5 nm, it is difficult to reflect a laser beam L in a desired manner. On the other hand, in the case where the thickness of the reflective layer 12 exceeds 300 nm, the surface smoothness of the reflective layer 12 becomes worse and it takes a longer time for forming the reflective layer 12, thereby lowering the productivity of the optical recording medium 10.

The first dielectric layer 15 and the second dielectric layer 13 serve to protect the recording layer 14. Degradation of recorded data can be prevented over a long period by the first dielectric layer 15 and the second dielectric layer 13.

The material for forming the first dielectric layer 15 and the second dielectric layer 13 is not particularly limited insofar as it is transparent in the wavelength range of the laser beam L and the first dielectric layer 15 and the second dielectric layer 13 can be formed of a dielectric material containing oxide, sulfide, nitride, carbide or a combination thereof, for example, as a primary component. In order to prevent the support substrate 11 from being deformed by heat and improve the characteristics of the first dielectric layer 15 and the second dielectric layer 13 for protecting the recording layer 14, it is preferable to form the first dielectric layer 15 and the second dielectric layer 13 of an oxide, sulfide, nitride or carbide of Al, Si, Ce, Ti, Zn, Ta or the like, such as $Al_2O_3$, AlN, ZnO, ZnS, GeN, GeCrN, CeO, $CeO_2$, SiO, $SiO_2$, $Si_3N_4$, SiC, $La_2O_3$, TaO, $TiO_2$, SiAlON (mixture of $SiO_2$, $Al_2O_3$, $Si_3N_4$ and AlN), LaSiON (mixture of $La_2O_3$, $SiO_2$ and $Si_3N_4$) or the like, or the mixture thereof.

The first dielectric layer 15 and the second dielectric layer 13 may be formed of the same dielectric material or of different dielectric materials. Moreover, at least one of the first dielectric layer 15 and the second dielectric layer 13 may have a multi-layered structure including a plurality of dielectric films.

The first dielectric layer 15 and the second dielectric layer 13 also serve to increase the difference in optical properties of the optical recording medium 10 between before and after data recording and it is therefore preferable to form the first dielectric layer 15 and the second dielectric layer 13 of a material having a high refractive index n in the wavelength range of the laser beam L. Further, since the recording sensitivity becomes low as the energy absorbed in the first dielectric layer 15 and the second dielectric layer 13 becomes large when the laser beam L is projected onto the optical recording medium 10 and data are to be recorded therein, it is preferable to form the first dielectric layer 15 and the second dielectric layer 13 of a material having a low extinction coefficient k in the wavelength range of the laser beam L.

In view of the above, it is particularly preferable to form the first dielectric layer 15 and the second dielectric layer 13 of a mixture of ZnS and $SiO_2$ whose mole ratio is 80:20.

The thickness of the first dielectric layer 15 and the second dielectric layer 13 is not particularly limited but is preferably from 3 nm to 200 nm. If the first dielectric layer 15 or the second dielectric layer 13 is thinner than 3 nm, it is difficult to obtain the above-described advantages. On the other hand, if the first dielectric layer 15 or the second dielectric layer 13 is thicker than 200 nm, it takes a long time to form the first dielectric layers 15 and the second dielectric layers 13, thereby lowering the productivity of the optical recording medium 10, and cracks may be generated in the first dielectric layers 15 and/or the second dielectric layers 13 owing to stress present in the first dielectric layers 15 and/or the second dielectric layer 13.

The recording layer 14 is adapted for forming a record mark and recording data therein.

In this embodiment, the recording layer 14 contains an alloy represented by a general formula: $(Ti_xM1_{1-x})_yM2_{1-y}$, where element M1 is Si or Al, element M2 is an element different from the element M1, x is equal to or larger than 0.3 and equal to or smaller than 0.8, and y is equal to or larger than 0.75 and equal to or smaller than 1.

The recording characteristic of the optical recording medium 10 improves as the content of the element M2 decreases and when y is equal to 1, in other words when the recording layer 14 consists of an alloy of Ti and Si or an alloy of Ti and Al, the recording characteristic of the optical recording medium 10 becomes best.

However, it is necessary for x defining the content of Ti and Si or Ti and Al in the alloy to be equal to or larger than 0.3 and equal to or smaller than 0.8. In the case where x is smaller than 0.3 or x exceeds 0.8, it is impossible to obtain a reproduced signal having a high C/N ratio and jitter of the reproduced signal and cross-talk of data become worse.

In order to obtain a reproduced signal having a higher C/N ratio and more effectively suppress cross-talk of data, it is preferable for x to be equal to or larger than 0.4 and equal to or smaller than 0.6 and it is particularly preferable for x to be about 0.5.

Preferably, the element M2 in the above mentioned general formula is selected from the group consisting of Si, Al and Fe.

Since each of Ti, Si and Al contained as an indispensable component in the alloy contained in the recording layer 14 and Si, Al and Fe contained in the alloy as an optional component is one of the most commonplace elements on earth and puts only an extremely light load on the global environment, an optical recording medium 10 including a recording layer 14 containing an alloy containing such elements can greatly lower the load placed the global environment.

As the thickness of the recording layer 14 increases, the recording sensitivity becomes worse and since the amount of a laser beam L absorbed in the recording layer 14 increases, the reflective coefficient is lowered. Therefore, it is preferable make the recording layer thinner in order to prevent the recording sensitivity from becoming worse and the reflective coefficient from being lowered, but in the case where the thickness of the recording layer 14 is too small, the change in reflection coefficient between before and after irradiation with the laser beam L is small, so that a reproduced signal having high strength (C/N ratio) cannot be obtained. Moreover, it becomes difficult to control the thickness of the recording layer 14.

Therefore, it is preferable to form the recording layer 14 to have a thickness of 3 nm to 40 nm and more preferable to form it to have a thickness of 5 nm to 30 nm.

The light transmission layer 16 serves to transmit a laser beam L and preferably has a thickness of 10 µm to 300 µm. More preferably, the light transmission layer 16 has a thickness of 50 µm to 150 µm.

The material used to form the light transmission layer 16 is not particularly limited but in the case where the light transmission layer 16 is to be formed by the spin coating process or the like, ultraviolet ray curable resin, electron beam curable resin or the like is preferably used. More preferably, the light transmission layer 16 is formed of acrylic ultraviolet ray curable resin or epoxy ultraviolet ray curable resin.

The light transmission layer 16 may be formed by adhering a sheet made of light transmittable resin to the surface of the first dielectric layer 15 using an adhesive agent.

The optical recording medium 10 having the above-described configuration can, for example, be fabricated in the following manner.

The support substrate 11 having grooves 11a and lands 11b on the surface thereof is first fabricated by an injection molding process using a stamper.

The reflective layer 12 is then formed on the surface of the substrate 11 formed with the grooves 11a and lands 11b.

The reflective layer 12 can be formed by a vapor growth process using chemical species containing elements for forming the reflective layer 12. Illustrative examples of the vapor growth processes include vacuum deposition process, sputtering process and the like but it is preferable to form the reflective layer 12 using the sputtering process.

The second dielectric layer 13 is then formed on surface of the reflective layer 12.

The second dielectric layer 13 can be also formed by a vapor growth process using chemical species containing elements for forming the second dielectric layer 13. Illustrative examples of the vapor growth processes include vacuum deposition process, sputtering process and the like but it is preferable to form the second dielectric layer 13 using the sputtering process.

The recording layer 14 is then formed on the second dielectric layer 13.

The recording layer 14 can be formed by a vapor growth process using an alloy containing at least Ti and one of Si and Al. Illustrative examples of the vapor growth processes include the vacuum deposition process, sputtering process and the like but it is preferable to form the second dielectric layer 13 using the sputtering process.

The inventors of the present invention conducted a study that led to a discovery regarding a recording layer 14 of an optical recording medium 10 formed by a sputtering process using a target containing an alloy containing at least Ti and one of Si and Al. Specifically, the inventors discovered that when the target contains an alloy represented by a general formula: $(Ti_{x'}M1_{1-x'})_{y'}M2_{1-y'}$, where x' is equal to or lager than 0.37 and equal to or smaller than 0.85 and y' is equal to or lager than 0.75 and equal to or smaller than 1, a recording layer 14 containing an alloy represented by the above mentioned general formula: $(Ti_xM1_{1-x})_yM2_{1-y}$, can be formed.

Such a target can be fabricated by mixing powder of Ti and powder of one of Si and Al and baking the mixed powder, for example.

The first dielectric layer 15 is then formed on the recording-layer 14. The first dielectric layer 15 can be also formed by a gas phase growth process using chemical species containing elements for forming the first dielectric layer 15.

Finally, the light transmission layer 16 is formed on the first dielectric layer 15. The light transmission layer 16 can be formed, for example, by applying an acrylic ultraviolet ray curable resin or epoxy ultraviolet ray curable resin adjusted to an appropriate viscosity onto the surface of the second dielectric layer 15 by spin coating to form a coating layer and irradiating the coating layer with ultraviolet rays to cure the coating layer.

Thus, the optical recording medium 10 was fabricated.

In the case where data are to be recording in the optical recording medium 10 of the above-described configuration, a laser beam L whose power is modulated is projected onto the recording layer 14 via the light transmission layer 16, while the optical recording medium 10 is being rotated.

In order to record data with high recording density, it is preferable to project a laser beam L having a wavelength λ of 450 nm or shorter onto the optical recording medium 10 via an objective lens (not shown) having a numerical aperture NA of 0.7 or more and it is more preferable that λ/NA be equal to or smaller than 640 nm.

In this embodiment, a laser beam L having a wavelength λ of 405 nm is projected onto the optical recording medium 10 via an objective lens having a numerical aperture NA of 0.85.

As a result, an alloy contained in the recording layer as a primary component is melted at the region of the recording layer 14 irradiated with the laser beam L and the phase thereof is changed when the melted alloy is solidified, whereby a record mark is formed and data are recorded in the recording layer 14 of the optical recording medium 10.

On the other hand, in the case where data recorded in the recording layer 14 of the optical recording medium 10 are to be reproduced, a laser beam L having a predetermined power is projected onto the recording layer 14 via the light transmission layer 16, while the optical recording medium 10 is being rotated, and the amount of the laser beam L reflected by the recording layer 14 is detected, whereby data recorded in the recording layer 14 of the optical recording medium 10 are reproduced.

Figure 3:
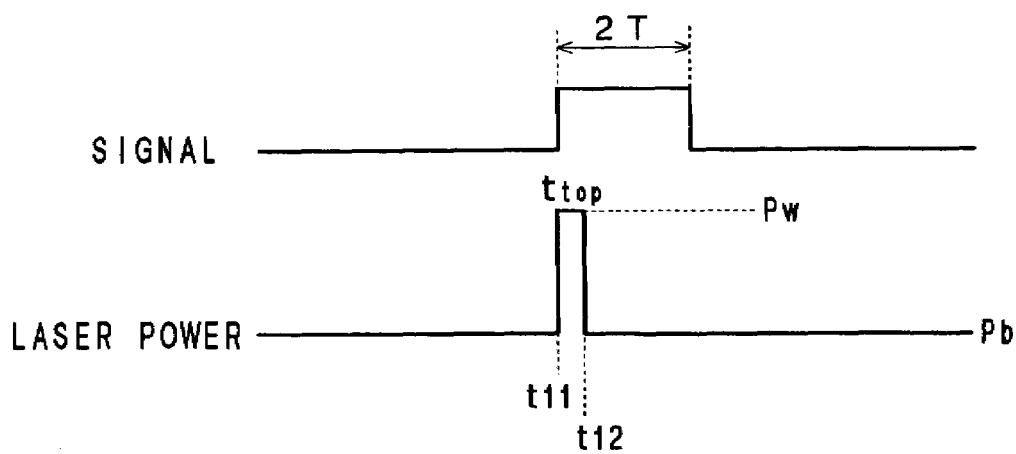
FIG. 3 is a diagram showing the waveform of a pulse train pattern for modulating the power of a laser beam in the case of recording 2T signals in a recording layer of an optical recording medium shown in FIGS. 1 and 2.
Figure 4:
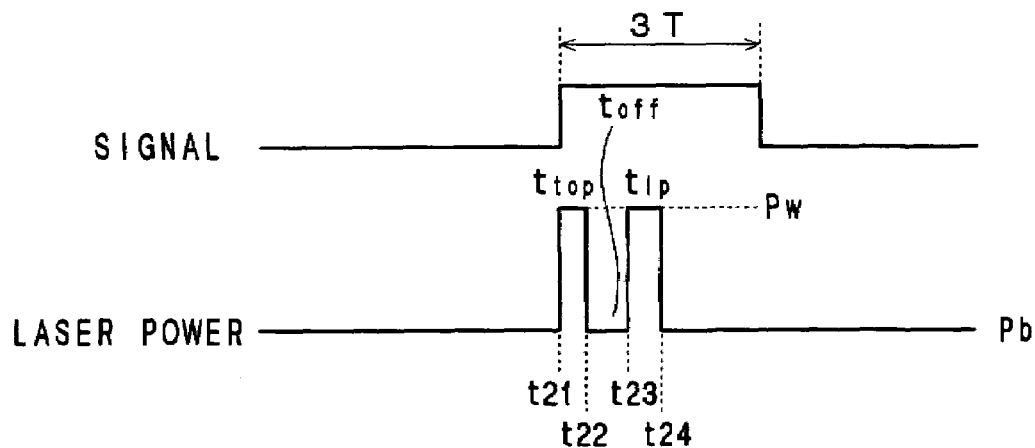
FIG. 4 is a diagram showing the waveform of a pulse train pattern for modulating the power of a laser beam in the case of recording 3T signals in a recording layer of an optical recording medium shown in FIGS. 1 and 2.

Each of FIGS. 3 to 6 is a diagram showing the waveform of a pulse pattern for modulating the power of the laser beam L in the case of recording data in the recording layer 14 of the optical recording medium 10, where FIG. 3 shows a pulse pattern used in the case of recording 2T signals, FIG. 4 shows a pulse pattern used in the case of recording 3T signals, FIG. 5 shows a pulse pattern used in the case of recording 4T signals and FIG. 6 shows random signals used in the case of recording one among a 5T signal to an 8T signal.

As shown in FIGS. 3 to 6, the power of the laser beam L is modulated between two levels, a recording power Pw and a bottom power Pb where Pw>Pb.

The recording power Pw is set to a high level capable of melting and changing the phase of an alloy contained in the recording layer 14 of the optical recording medium 10 when the laser beam L set to the recording power Pw is projected onto the recording layer 14. On the other hand, the bottom power Pb is set to an extremely low level at which a region of the recording layer 14 heated by irradiation with the laser beam L set to the recording power Pw can be cooled during irradiation with the laser beam L set to the bottom power Pb.

As shown in FIG. 3, in the case of recording a 2T signal in the recording layer 14 of the optical recording medium 10, the power of the laser beam L is modulated to be increased from the bottom power Pb to the recording power Pw at a time t11 and decreased from the recording power Pw to the bottom power Pb at a time t12 after passage of a predetermined time period $t_{top}$.

Therefore, in the case of recording a 2T signal in the L0 information recording layer 20 or the L1 information recording layer 30 of the optical recording medium 10, the number of a pulse having a level equal to the recording power Pw is set to be 1.

On the other hand, as shown in FIG. 4, in the case of recording a 3T signal in the recording layer 14 of the optical recording medium 10, the power of the laser beam L is modulated so that it is increased from the bottom power Pb to the recording power Pw at a time t21, decreased from the recording power Pw to the bottom power Pb at a time t22 after passage of a predetermined time period $t_{top}$, increased from the bottom power Pb to the recording power Pw at a time t23 after passage of a predetermined time period $t_{off}$ and decreased from the recording power Pw to the bottom power Pb at a time t24 after passage of a predetermined time period $t_{lp}$.

Therefore, in the case of recording a 3T signal in the recording layer 14 of the optical recording medium 10, the number of pulses each having a level equal to the recording power Pw is set to be 2.

Further, as shown in FIG. 5, in the case of recording a 4T signal in the recording layer 14 of the optical recording medium 10, the power of the laser beam L is modulated so that it is increased from the bottom power Pb to the recording power Pw at a time t31, decreased from the recording power Pw to the bottom power Pb at a time t32 after passage of a predetermined time period $t_{top}$, increased from the bottom power Pb to the recording power Pw at a time t33 after passage of a predetermined time period $t_{off}$, decreased from the recording power Pw to the bottom power Pb at a time t34 after passage of a predetermined time period $t_{mp}$, increased from the bottom power Pb to the recording power Pw at a time t35 after passage of a predetermined time period $t_{top}$ and decreased from the recording power Pw to the bottom power Pb at a time t36 after passage of a predetermined time period $t_{lp}$.

Therefore, in the case of recording a 4T signal in the recording layer 14 of the optical recording medium 10, the number of pulses each having a level equal to the recording power Pw is set to be 3.

Moreover, as shown in FIG. 6, in the case of recording one among a 5T signal to an 8T signal in the recording layer 14 of the optical recording medium 10, the power of the laser beam L is modulated so that it is increased from the bottom power Pb to the recording power Pw at a time t41, held at the recording power Pw during the time period $t_{top}$, the time periods $t_{mp}$ and the time period $t_{lp}$, held at the bottom power Pb during the time periods $t_{off}$ and decreased from the recording power Pw to the bottom power Pb at a time t48.

Therefore, in the case of recording one among a 5T signal to a 8T signal in the recording layer 14 of the optical recording medium 10, the number of pulses each having a level equal to the recording power Pw is set to be 4 to 7.

When the recording layer 14 is irradiated with the laser beam L set to the recording power Pw, an alloy contained in the recording layer 14 as a primary component is melted at a region of the recording layer 14 irradiated with the laser beam L, and when it is irradiated with the laser beam L set to the bottom power Pb, the melted alloy is solidified and the phase of the alloy is changed, whereby a record mark is formed and data are recorded in the recording layer 14.

Since the reflective coefficient with respect to a laser beam L of a region of the recording layer 14 where the record mark is formed in this manner and that of a region where no record mark is formed, namely, a blank region, are greatly different, data recorded in the recording layer 14 can be reproduced utilizing the difference in the reflection coefficients between the region of the recording layer 14 where the record mark is formed and the blank region.

The length of the record mark and the length of the blank region between the record mark and the neighboring record mark constitute data recorded in the recording layer 14. The record mark and the blank region are formed so as to have a length equal to an integral multiple of T, where T is a length corresponding to one cycle of a reference clock. In the case where 1,7 RLL modulation code is employed, record marks and blank regions having a length of 2T to 8T are formed.

According to this embodiment, since the recording layer 14 of the optical recording medium 10 contains an alloy represented by a general formula: $(Ti_xM1_{1-x})_yM2_{1-y}$, where element M1 is Si or Al, element M2 is an element different from the element M1, x is equal to or larger than 0.3 and equal to or smaller than 0.8, and y is equal to or larger than 0.75 and equal to or smaller than 1 and since each of Ti, Si and Al contained as an indispensable component in the alloy contained in the recording layer 14 and Si, Al and Fe contained in the alloy as an optional component is one of the most commonplace elements on earth and puts only an extremely light load on the global environment, an optical recording medium 10 including a recording layer 14 containing an alloy containing such elements can greatly lower the load placed the global environment.

Further, according to this embodiment, since the content of Ti and Si or Ti and Al contained as indispensable components in the alloy contained in the recording layer 14 is determined so that x is equal to or larger than 0.3 and equal to or smaller than 0.8, it is possible to reproduce a signal having a high C/N ratio and decreased jitter and effectively suppress cross-talk of data.

Figure 7:
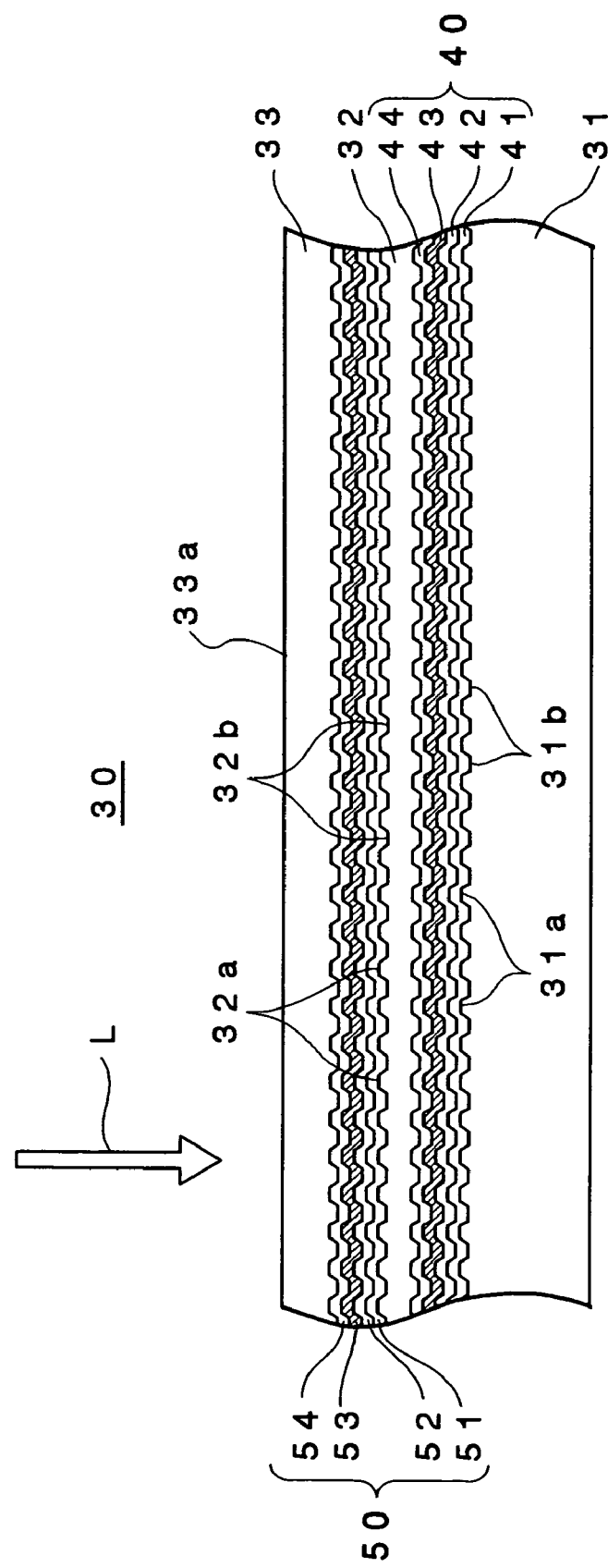
FIG. 7 is a schematic cross-sectional view showing an optical recording medium which is another preferred embodiment of the present invention.

FIG. 7 is a schematic cross-sectional view showing an optical recording medium which is another preferred embodiment of the present invention.

As shown in FIG. 7, the optical recording medium 30 according to this embodiment includes a support substrate 31, a transparent intermediate layer 32, a light transmission layer (protective layer) 33, an L0 information recording layer 40 formed between the support substrate 31 and the transparent intermediate layer 32, and an L1 information recording layer 50 formed between the transparent layer 32 and the light transmission layer 33.

The L0 information recording layer 40 and the L1 information recording layer 50 are information recording layers in which data are recorded, i.e., the optical recording medium 30 according to this embodiment includes two information recording layers.

The L0 information recording layer 40 constitutes an information recording layer far from a light incident plane 33a and is constituted by laminating a reflective layer 41, a fourth dielectric layer 42, an L0 recording layer 43 and a third dielectric layer 44 from the side of the support substrate 31.

On the other hand, the L1 information recording layer 50 constitutes an information recording layer close to the light incident plane 33a and is constituted by laminating a reflective layer 51, a second dielectric layer 52, an L1 recording layer 53 and a first dielectric layer 54 from the side of the support substrate 31.

The support substrate 31 serves as a support for ensuring the mechanical strength and thickness of about 1.2 mm required by the optical recording medium 30 and is formed in the same way as the support substrate 11 of the optical recording medium 10 shown in FIGS. 1 and 2.

As shown in FIG. 7, grooves 31a and lands 31b are alternately and spirally formed on the surface of the support substrate 31 so as to have a depth and a pitch similar to those of the optical recording medium 10 shown in FIGS. 1 and 2. The grooves 31a and/or lands 31b serve as a guide track for the laser beam L when data are to be recorded in the L0 information recording layer 40 or when data are to be reproduced from the L0 information recording layer 40.

The transparent intermediate layer 32 serves to space the L0 information recording layer 40 and the L1 information recording layer 50 apart by a physically and optically sufficient distance.

As shown in FIG. 7, grooves 32a and lands 32b are alternately formed on the surface of the transparent intermediate layer 32. The grooves 32a and/or lands 32b formed on the surface of the transparent intermediate layer 32 serve as a guide track for the laser beam L when data are to be recorded in the L1 layer 50 or when data are to be The depth of the groove 32a and the pitch of the grooves 32a can be set to be substantially the same as those of the grooves 31a formed on the surface of the support substrate 31.

It is preferable to form the transparent intermediate layer 32 so as to have a thickness of 5 μm to 50 μm and it is more preferable to form it so as to have a thickness of 10 μm to 40 μm.

The material for forming the transparent intermediate layer 32 is not particularly limited and an ultraviolet ray curable acrylic resin is preferably used for forming the transparent intermediate layer 32.

It is necessary for the transparent intermediate layer 32 to have sufficiently high light transmittance since the laser beam L passes through the transparent intermediate layer 32 when data are to be recorded in the L0 information recording layer 40 and data recorded in the L0 information recording layer 40 are to be reproduced.

The transparent intermediate layer 32 is preferably formed by a 2P process using a stamper but the transparent intermediate layer 32 may be formed by other processes.

The light transmission layer 33 serves to transmit the laser beam L and the light incident plane 33a is constituted by one of the surfaces thereof.

The light transmission layer 33 is formed in the same way as the light transmission layer 16 of the optical recording medium 10 shown in FIGS. 1 and 2.

The L0 recording layer 43 included in the L0 information recording layer 40 contains an alloy represented by the above mentioned general formula: $(Ti_xM1_{1-x})_yM2_{1-y}$.

Similarly, the L1 recording layer 53 included in the L1 information recording layer 50 contains an alloy represented by the above mentioned general formula: $(Ti_xM1_{1-x})_yM2_{1-y}$.

Each of the reflective layer 41 included in the L0 information recording layer 40 and the reflective layer 51 included in the L1 information recording layer 50 is formed in the same way as the reflective layer 12 of the optical recording medium 10 shown in FIGS. 1 and 2.

Each of the fourth dielectric layer 42 and the third dielectric layer 44 included in the L0 information recording layer 40 and the second dielectric layer 52 and the first dielectric layer 54 included in the L1 information recording layer 50 is formed in the same way as the first dielectric layer 15 or the second dielectric layer 13 of the optical recording medium 10 shown in FIGS. 1 and 2.

Each of the reflective layer 41, the fourth dielectric layer 42, the L0 recording layer 43 and the third dielectric layer 44 included in the L0 information recording layer 40, and the reflective layer 51, the second dielectric layer 52, the L1 recording layer 53 and the first dielectric layer 54 included in the L1 information recording layer 50 can be formed by a vapor growth process using chemical species containing elements for forming it. Illustrative examples of the vapor growth processes include a sputtering process, vacuum deposition process and the like and the sputtering process is preferably used for forming them.

When data are to be recorded in the L0 recording layer 43 included in the L0 information recording layer 40 of the optical recording medium 30, a laser beam L set to the recording power Pw is focused onto the L0 recording layer 43 via the light transmission layer 33. As a result, an alloy contained in the L0 recording layer 43 as a primary component is melted at the region of the L0 recording layer 43 irradiated with the laser beam L and when the laser beam L is set to the bottom power Pb, the melted alloy is solidified and the phase of the alloy is changed, whereby a record mark is formed and data are recorded in the L0 recording layer 43.

On the other hand, when data are to be recorded in the L1 recording layer 53 included in the L1 information recording layer 50 of the optical recording medium 30, a laser beam L set to the recording power Pw is focused onto the L1 recording layer 53 via the light transmission layer 33. As a result, an alloy contained in the L1 recording layer 53 as a primary component is melted at the region of the L1 recording layer 53 irradiated with the laser beam L and when the laser beam L is set to the bottom power Pb, the melted alloy is solidified and the phase of the alloy is changed, whereby a record mark is formed and data are recorded in the L1 recording layer 53.

When data recorded in the L0 recording layer 43 included in the L0 information recording layer 40 of the optical recording medium 30 are to be reproduced, a laser beam L set to a reproducing power is focused onto the L0 recording layer 43 via the light transmission layer 33 and the amount of the laser beam L reflected by the L0 recording layer 43 is detected.

On the other hand, when data recorded in the L1 recording layer 53 included in the L1 information recording layer 50 of the optical recording medium 30 are to be reproduced, a laser beam L set to be a reproducing power is focused onto the L1 recording layer 53 via the light transmission layer 33 and the amount of the laser beam L reflected by the L1 recording layer 53 is detected.

According to this embodiment, each of the L0 recording layer 43 and the L1 recording layer 53 contains an alloy represented by a general formula: $(Ti_xM1_{1-x})_yM2_{1-y}$, where element M1 is Si or Al, element M2 is an element different from the element M1, x is equal to or larger than 0.3 and equal to or smaller than 0.8, and y is equal to or larger than 0.75 and equal to or smaller than 1 and since each of Ti, Si and Al contained as an indispensable component in the alloy contained in the recording layer 14 and Si, Al and Fe contained in the alloy as an optional component is one of the most commonplace elements on earth and puts only an extremely light load on the global environment, an optical recording medium 10 including a recording layer 14 containing an alloy containing such elements can greatly lower the load placed the global environment.

Further, according to this embodiment, since the content of Ti and Si or Ti and Al contained as indispensable components in the alloy contained in each of the L0 recording layer 43 and the L1 recording layer 53 is determined so that x is equal to or larger than 0.3 and equal to or smaller than 0.8, it is possible to reproduce a signal having a high C/N ratio and decreased jitter and effectively suppress cross-talk of data.

WORKING EXAMPLES AND COMPARATIVE EXAMPLES

Hereinafter, working examples will be set out in order to further clarify the advantages of the present invention.

Working Example 1

An optical recording medium sample #1-1 was fabricated in the following manner.

A disk-like polycarbonate substrate having a thickness of 1.1 mm and a diameter of 120 mm and formed with grooves and lands on the surface thereof was first fabricated by an injection molding process so that the track pitch (groove pitch) was equal to 0.32 µm.

Then, the polycarbonate substrate was set on a sputtering apparatus and a reflective layer consisting of an alloy containing Ag, Pd and Cu and having a thickness of 100 nm, a second dielectric layer containing a mixture of ZnS and $SiO_2$ and having a thickness of 25 nm, a recording layer containing an alloy represented by a composition formula: $Ti_xSi_{1-x}$ and having a thickness of 10 nm and a first dielectric film containing the mixture of ZnS and $SiO_2$ and having a thickness of 20 nm were sequentially formed on the surface of the polycarbonate substrate on which the grooves and lands were formed, using the sputtering process.

The mole ratio of ZnS to $SiO_2$ in the mixture of ZnS and $SiO_2$ contained in the first dielectric layer and the second dielectric layer was 80:20.

Further, the composition of the alloy contained in the recording layer was determined so that the value of x in the composition formula: $Ti_xSi_{1-x}$ was equal to 0.2 (20 atomic %).

Further, the polycarbonate substrate formed with the reflective layer, the second dielectric layer, the recording layer and the first dielectric layer on the surface thereof was set on a spin coating apparatus and the first dielectric layer was coated using the spin coating method with a resin solution prepared by dissolving acrylic ultraviolet ray curable resin in a solvent to form a coating layer and the coating layer was irradiated with ultraviolet rays, thereby curing the acrylic ultraviolet ray curable resin to form a light transmission layer having a thickness of 100 µm.

Thus, the optical recording medium sample #1-1 was fabricated.

Further, optical recording medium samples #1-2 to #1-5 were fabricated in the same way as the optical recording medium sample #1-1 except that the value of x in the composition formula: $Ti_xSi_{1-x}$, was stepwise increased up to 1 (100 atomic %) to form recording layers.

Each of the optical recording medium samples #1-1 to #1-5 was set in an optical recording medium evaluation apparatus "DDU1000" (Product Name) manufactured by Pulstec Industrial Co., Ltd. and a laser beam having a wavelength of 405 nm whose power was modulated in accordance with the pulse pattern shown in FIG. 3 was focused onto the recording layer using an objective lens whose numerical aperture was 0.85 via the light transmission layer while each of the samples was rotated at a linear velocity of 5.3 m/sec, thereby recording a random signal including a 2T signal to an 8T signal therein in the 1,7 RLL Modulation Code.

The recording power of the laser beam was set to 7.0 mW, while the bottom power of the laser beam was fixed at 0.1 mW.

Then, each of the optical recording medium samples #1-1 to #1-5 was set in the above mentioned optical recording medium evaluation apparatus and a laser beam having a wavelength of 405 nm was focused onto the recording layer of each sample using an objective lens whose numerical aperture was 0.85 via the light transmission layer while each sample was rotated at a linear velocity of 5.3 m/sec, thereby reproducing a signal recorded in the recording layer and clock jitter of the reproduced was measured. The reproducing power of the laser beam was set to 0.35 mW.

The fluctuation σ of the reproduced signal was measured using a time interval analyzer and the clock jitter was calculated as σ/Tw, where Tw was one clock period.

Further, similarly to the above, a random signal was recorded in each of the optical recording medium samples #1-1 to #1-5 while increasing the recording power of the laser beam in increments of 0.2 mW up to 10.0 mW, thereby reproducing the random signal from each sample and measuring clock jitter of the reproduced signal similarly to the above.

The lowest clock jitter was determined from among the thus measured clock jitters and the recording power at which the clock jitter of the reproduced signal was lowest was determined as an optimum recording power of the laser beam.

Then, each of the optical recording medium samples #1-1 to #1-5 was set in the above mentioned optical recording medium evaluation apparatus and a 2T signal in the 1,7 RLL Modulation Code was recorded in the recording layer of each sample in the same manner as that of recording the random signal in the recording layer of each sample except that the recording power of the laser beam was set to the optimum recording power.

Further, each of the optical recording medium samples #1-1 to #1-5 was set in the above mentioned optical recording medium evaluation apparatus and in the same manner as that of reproducing the random signal from the recording layer of each sample, the 2T signal recorded in the recording layer of each sample was reproduced, thereby measuring the C/N ratio of the reproduced signal.

Figure 8:
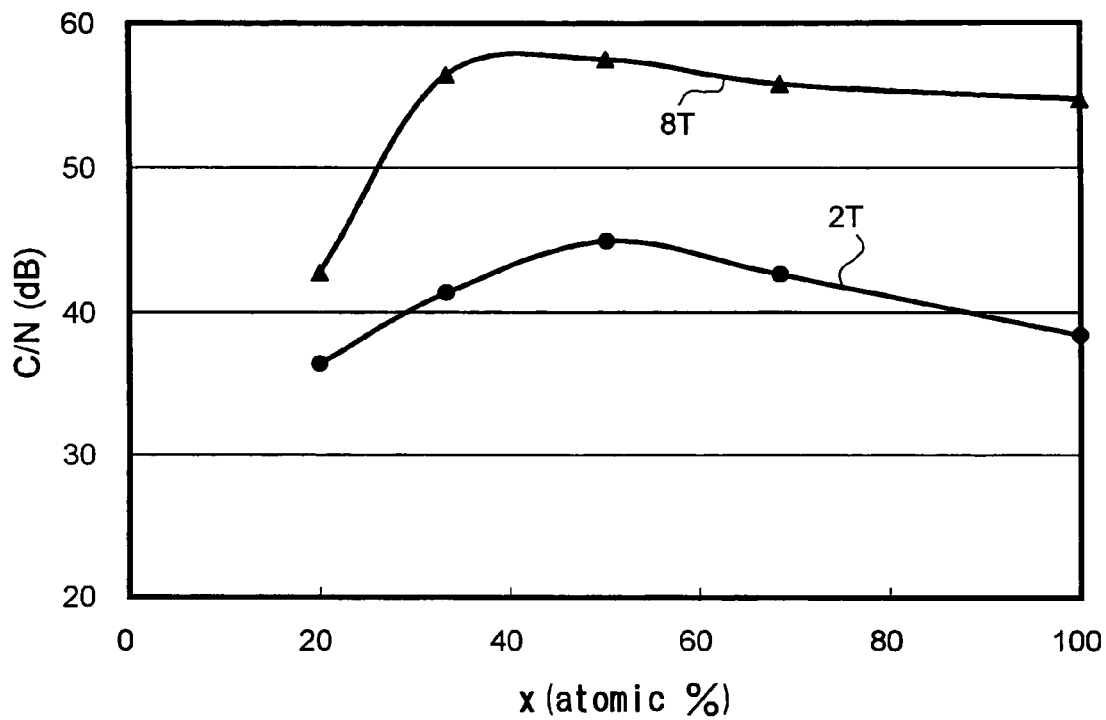
FIG. 8 is a graph showing how a C/N ratio of a signal reproduced from each of optical recording medium samples #1-1 to #1-5 varied with a value of x.

The results of the measurement are shown in FIG. 8.

Then, each of the optical recording medium samples #1-1 to #1-5 was set in the above mentioned optical recording medium evaluation apparatus and an 8T signal in the 1,7 RLL Modulation Code was recorded in the recording layer of each sample in the same manner as that of recording the random signal in the recording layer of each sample except that the recording power of the laser beam was set to the optimum recording power.

Further, each of the optical recording medium samples #1-1 to #1-5 was set in the above mentioned optical recording medium evaluation apparatus and in the same manner as that of reproducing the random signal from the recording layer of each sample, the 8T signal recorded in the recording layer of each sample was reproduced, thereby measuring the C/N ratio of the reproduced signal.

The results of the measurement are shown in FIG. 8.

As shown in FIG. 8, it was found that in the case where the value of x in the composition formula: $Ti_xSi_{1-x}$ was 0.3 (30 atomic %) to 0.8 (80 atomic %), the C/N ratio of the signal obtained by reproducing the 2T signal was equal to or higher than 40 dB and the C/N ratio of the signal obtained by reproducing the 8T signal was equal to or higher than 45 dB and that each sample could be practically used as an optical recording medium.

Further, it was found that in the case where the value of x in the composition formula: $Ti_xSi_{1-x}$ was 0.4 (40 atomic %) to 0.6 (60 atomic %), both the C/N ratio of the signal obtained by reproducing the 2T signal and the C/N ratio of the signal obtained by reproducing the 8T signal became higher and that in the case where the value of x was about 0.5 (50 atomic %), and both the C/N ratio of the signal obtained by reproducing the 2T signal and the C/N ratio of a signal obtained by reproducing the 8T signal became maximum.

Working Example 2

In the same manner as in Working Example 1, a random signal including a 2T signal to an 8T signal in the 1,7 RLL Modulation Code was recorded in each of the optical recording medium samples #1-1 to #1-5 by setting the recording power of the laser beam to the optimum recording power. Then, the thus recorded random signal was reproduced from each of the optical recording medium samples #1-1 to #1-5 and clock jitter of the reproduced signal was measured.

Figure 9:
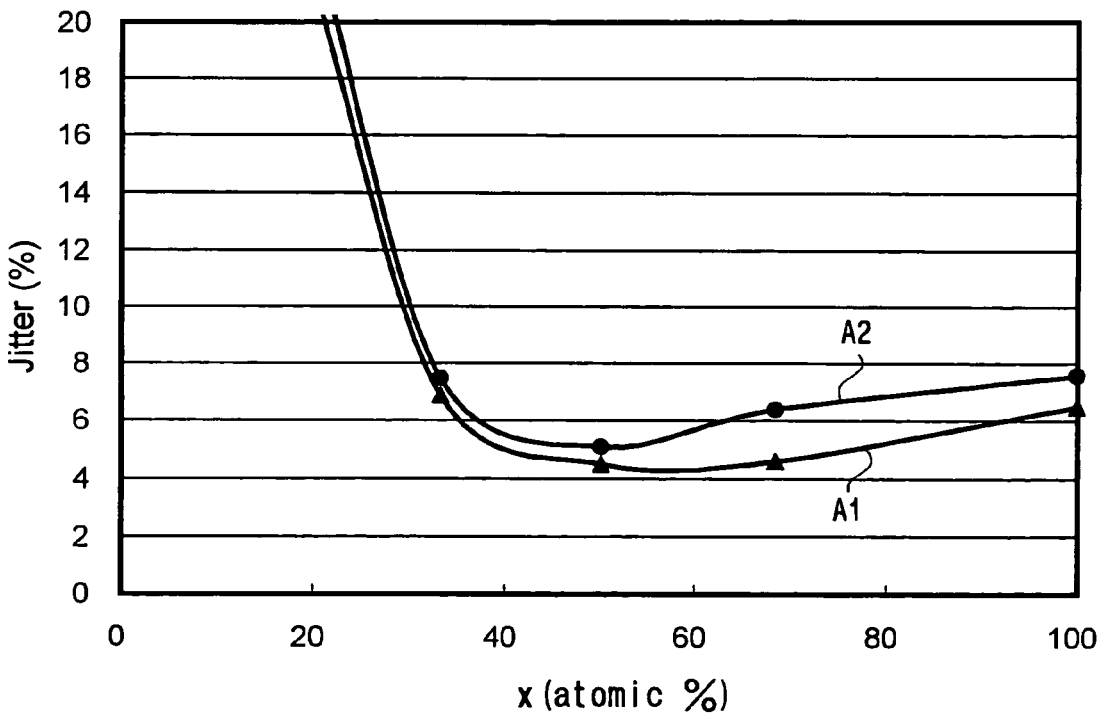
FIG. 9 is a graph showing how single jitter and cross jitter of a signal reproduced from each of optical recording medium samples #1-1 to #1-5 varied with a value of x.

The results of the measurement are shown in FIG. 9.

In FIG. 9, the curve A1 shows clock jitter (single jitter) of a reproduced signal obtained from a track located between tracks in which no data were reproduced and the curve A2 shows clock jitter (cross jitter) of a reproduced signal obtained from a track located between tracks in which data were recorded.

As shown in FIG. 9, it was found that both single jitter and cross jitter were high in the case where the value of x in the composition formula: $Ti_xSi_{1-x}$ was smaller than 0.3 (30 atomic %). It was further found that in the case where the value of x was 0.4 (40 atomic %) to 0.6 (60 atomic %), the difference in values between single jitter and cross jitter was small and that that in the case where the value of x was about 0.5 (50 atomic %), the difference in values between single jitter and cross jitter was very small.

Therefore, it was found that in order to improve cross-talk characteristics of an optical recording medium, it was preferable to determine the composition of the alloy contained in the recording layer so that the value of x in the composition formula: $Ti_xSi_{1-x}$ was 0.4 (40 atomic %) to 0.6 (60 atomic %) and that it was particularly preferable to determined the composition of the alloy contained in the recording layer so that the value of x was about 0.5.

Working Example 3

An optical recording medium sample #3-1 was fabricated in the same manner as in Working Example 1 except that a recording layer containing an alloy represented by a composition formula: $(Ti_{0.5}Si_{0.5})_yAl_{1-y}$ was formed.

The composition of the alloy contained in the recording layer was determined so that the value of y in the composition formula: $(Ti_{0.5}Si_{0.5})_yAl_{1-y}$ was equal to 0.67 (67 atomic %).

Further, optical recording medium samples #3-2 to #3-4 were fabricated in the same way as the optical recording medium sample #3-1 except that the value of y in the composition formula: $(Ti_{0.5}Si_{0.5})_yAl_{1-y}$ was stepwise increased up to 1 (100 atomic %) to form recording layers.

Further, each of the optical recording medium samples #3-1 to #3-4 was set in the above mentioned optical recording medium evaluation apparatus and in the same manner as in Working Example 1, a random signal including a 2T signal to an 8T signal in the 1,7 RLL Modulation Code was recorded in each of the optical recording medium samples #3-1 to #3-4 using a laser beam whose recording power was set to 7.0 mW. Then, in the same manner as in Working Example 1, the thus recorded random signal was reproduced from each of the optical recording medium samples #3-1 to #3-4 and clock jitter of the reproduced signal was measured.

Further, similarly to the above, a random signal was recorded in each of the optical recording medium samples #3-1 to #3-4 while increasing the recording power of the laser beam in increments of 0.2 mW up to 10.0 mW, thereby reproducing the random signal from each sample and measuring clock jitter of the reproduced signal similarly to the above.

The lowest clock jitter was determined from among the thus measured clock jitters and the recording power at which the clock jitter of the reproduced signal was lowest was determined as an optimum recording power of the laser beam.

Further, a 2T signal was recorded in each of the optical recording medium samples #3-1 to #3-4 using a laser beam whose recording power was set to the optimum recording power in the same manner as that of recording the random signal in the recording layer of each sample.

Then, in the same manner as that of reproducing the random signal from the recording layer of each sample, the 2T signal recorded using a laser whose power was set to the optimum recording power was reproduced from each of the optical recording medium samples #3-1 to #3-4, thereby measuring the C/N ratio of the reproduced signal.

Figure 10:
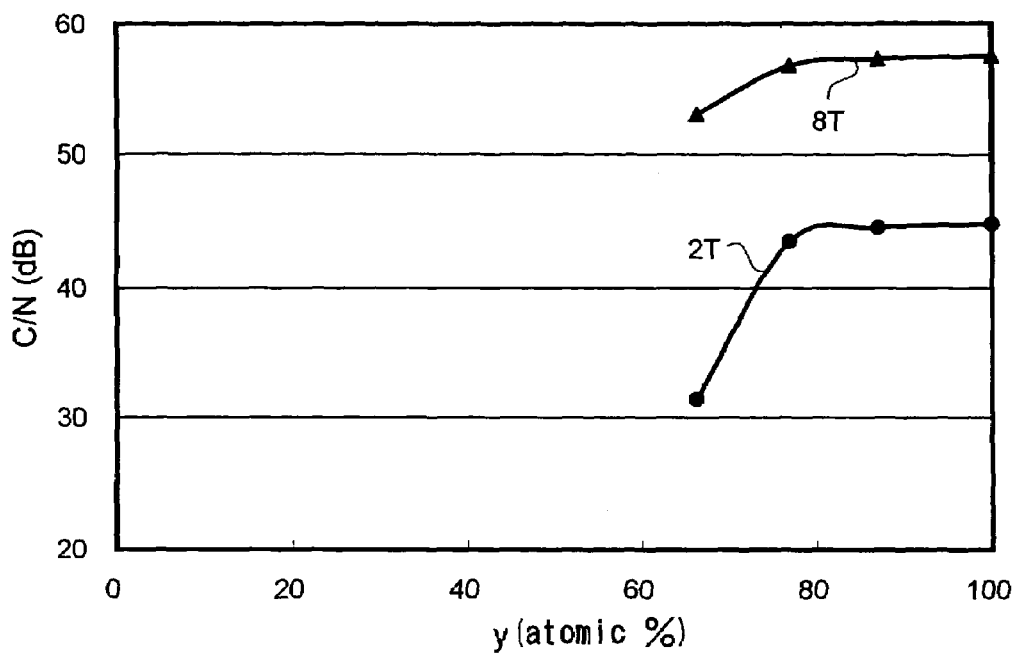
FIG. 10 is a graph showing how a C/N ratio of a signal reproduced from each of optical recording medium samples #3-1 to #3-4 varied with a value of y.

The results of the measurement are shown in FIG. 10.

Further, each of the optical recording medium samples #3-1 to #3-4 was set in the above mentioned optical recording medium evaluation apparatus and an 8T signal in the 1,7 RLL Modulation Code was recorded in each of the optical recording medium samples #3-1 to #3-4 using a laser beam whose power was set to the optimum recording power in the same manner as that of recording the 2T signal in the recording layer of each sample.

Then, in the same manner as that of reproducing the 2T signal from the recording layer of each sample, the 8T signal recorded using a laser whose power was set to the optimum recording power was reproduced from each of the optical recording medium samples #3-1 to #3-4, thereby measuring the C/N ratio of the reproduced signal.

The results of the measurement are shown in FIG. 10.

As shown in FIG. 10, it was found that in the case where the value of y in the composition formula: $(Ti_{0.5}Si_{0.5})_y Al_{1-y}$ was 0.75 (75 atomic %) to 1 (100 atomic %), both the C/N ratio of the signal obtained by reproducing the 2T signal and the C/N ratio of the signal obtained by reproducing the 8T signal were substantially constant and that in the case where the value of y in the composition formula: $(Ti_{0.5}Si_{0.5})_y Al_{1-y}$ was smaller than 0.75 (75 atomic %), both the C/N ratio of the signal obtained by reproducing the 2T signal and the C/N ratio of the signal obtained by reproducing the 8T signal were extremely low.

Therefore, it was found that in the case where the value of y in the composition formula: $(Ti_{0.5}Si_{0.5})_y Al_{1-y}$ was equal to or larger than 0.75 (75 atomic %), the C/N ratio of the reproduced signal was hardly influenced by any Al contained in the alloy.

Working Example 4

In the same manner as in Working Example 3, a random signal including a 2T signal to an 8T signal in the 1,7 RLL Modulation Code was recorded in each of the optical recording medium samples #3-1 to #3-4 by setting the recording power of the laser beam to the optimum recording power. Then, the thus recorded random signal was reproduced from each of the optical recording medium samples #3-1 to #3-4 and clock jitter of the reproduced signal was measured.

Figure 11:
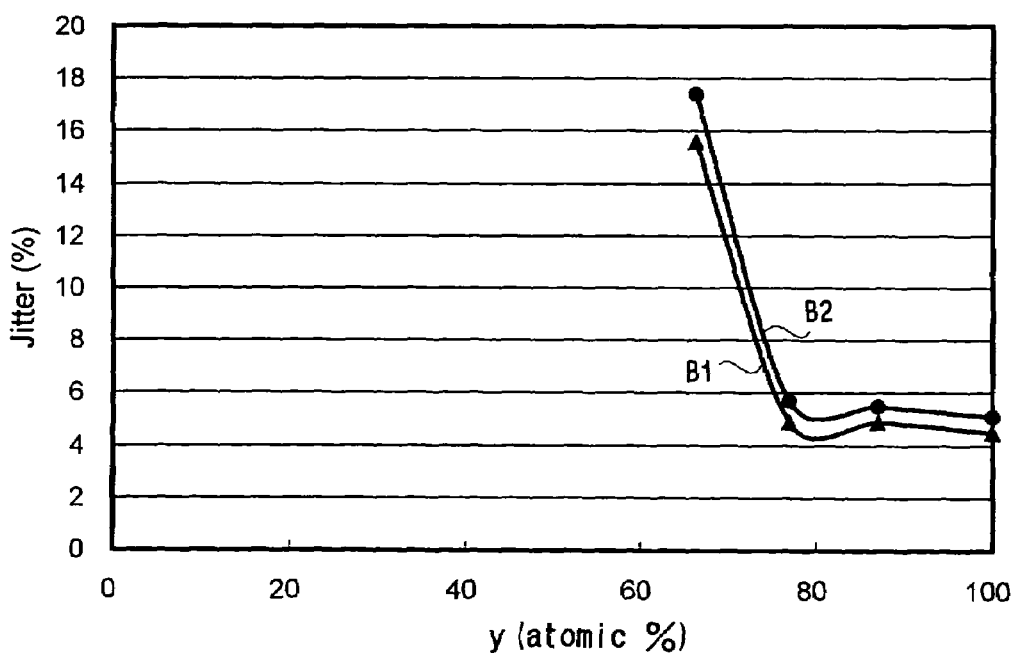
FIG. 11 is a graph showing how single jitter and cross jitter of a signal reproduced from each of optical recording medium samples #3-1 to #3-4 varied with a value of y.

The results of the measurement are shown in FIG. 11.

In FIG. 11, the curve B1 shows clock jitter (single jitter) of a reproduced signal obtained from a track located between tracks in which no data were reproduced and the curve B2 shows clock jitter (cross jitter) of a reproduced signal obtained from a track located between tracks in which data were recorded.

As shown in FIG. 11, it was found that in the case where the value of y in the composition formula: $(Ti_{0.5}Si_{0.5})_y Al_{1-y}$ was 0.75 (75 atomic %) to 1 (100 atomic %), both single jitter and cross jitter were substantially constant and that in the case where the value of y in the composition formula: $(Ti_{0.5}Si_{0.5})_y Al_{1-y}$ was smaller than 0.75 (75 atomic %), both single jitter and cross jitter were extremely high.

Therefore, it was found that in the case where the value of y in the composition formula: $(Ti_{0.5}Si_{0.5})_y Al_{1-y}$ was equal to or larger than 0.75 (75 atomic %), single jitter and cross jitter of a reproduced signal were hardly influenced by any Al contained in the alloy.

Working Example 5

An optical recording medium sample #5-1 was fabricated in the same manner as in Working Example 1 except that a recording layer containing an alloy represented by a composition formula: $Ti_x Al_{1-x}$ and a first dielectric layer having a thickness of 35 nm was formed.

The composition of the alloy contained in the recording layer was determined so that the value of x in the composition formula: $Ti_x Al_{1-x}$ was equal to 0.15 (15 atomic %).

Further, optical recording medium samples #5-2 to #5-5 were fabricated in the same way as the optical recording medium sample #5-1 except that the value of x in the composition formula: $Ti_x Al_{1-x}$ was stepwise increased up to 1 (100 atomic %) to form recording layers.

Then, each of the optical recording medium samples #5-1 to #5-5 was set in the above mentioned optical recording medium evaluation apparatus and in the same manner as in Working Example 1, a random signal including a 2T signal to an 8T signal in the 1,7 RLL Modulation Code was recorded in each of the optical recording medium samples #5-1 to #5-5 using a laser beam whose recording power was set to 7.0 mW. Then, the thus recorded random signal was reproduced from each of the optical recording medium samples #5-1 to #5-5 and clock jitter of the reproduced signal was measured.

Further, similarly to the above, a random signal was recorded in each of the optical recording medium samples #5-1 to #5-5 while increasing the recording power of the laser beam in increments of 0.2 mW up to 10.0 mW, thereby reproducing the random signal from each sample and measuring clock jitter of the reproduced signal similarly to the above.

The lowest clock jitter was determined from among the thus measured clock jitters and the recording power at which the clock jitter of the reproduced signal was lowest was determined as an optimum recording power of the laser beam.

Further, a 2T signal was recorded in each of the optical recording medium samples #5-1 to #5-5 using a laser beam whose recording power was set to the optimum recording power in the same manner as that of recording the random signal in the recording layer of each sample .

Then, in the same manner as that of reproducing the random signal from the recording layer of each sample, the 2T signal recorded using a laser whose power was set to the optimum recording power was reproduced from each of the optical recording medium samples #5-1 to #5-5, thereby measuring the C/N ratio of the reproduced signal.

Figure 12:
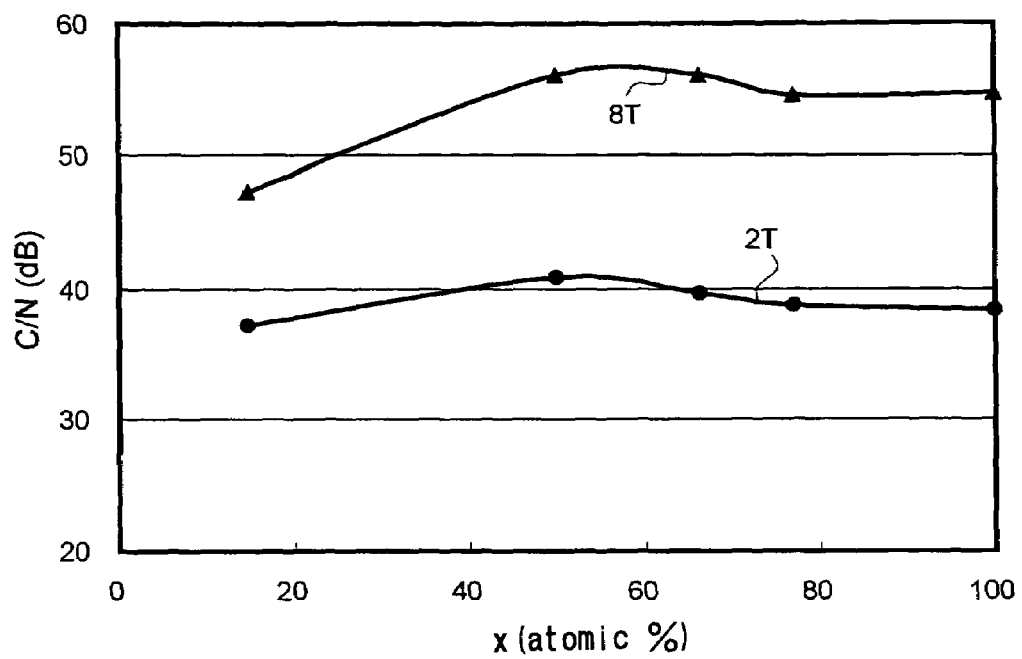
FIG. 12 is a graph showing how a C/N ratio of a signal reproduced from each of optical recording medium samples #5-1 to #5-5 varied with a value of x.

The results of the measurement are shown in FIG. 12.

Further, each of the optical recording medium samples #5-1 to #5-5 was set in the above mentioned optical recording medium evaluation apparatus and an 8T signal in the 1,7 RLL Modulation Code was recorded in each of the optical recording medium samples #5-1 to #5-5 using a laser beam whose recording power was set to the optimum recording power in the same manner as that of recording the random signal in the recording layer of each sample.

Then, in the same manner as that of reproducing the random signal from the recording layer of each sample, the 8T signal recorded using a laser whose power was set to the optimum recording power was reproduced from each of the optical recording medium samples #5-1 to #5-5, thereby measuring the C/N ratio of the reproduced signal.

The results of the measurement are shown in FIG. 12.

As shown in FIG. 12, it was found that in the case where the value of x in the composition formula: $Ti_xAl_{1-x}$ was 0.3 (30 atomic %) to 0.8 (80 atomic %), the C/N ratio of the signal obtained by reproducing the 2T signal was equal to or higher than 40 dB and the C/N ratio of the signal obtained by reproducing the 8T signal was equal to or higher than 45 dB and that each sample could be practically used as an optical recording medium.

Further, it was found that in the case where the value of x in the composition formula: $Ti_xAl_{1-y}$ was 0.4 (40 atomic %) to 0.6 (60 atomic %), both the C/N ratio of the signal obtained by reproducing the 2T signal and the C/N ratio of the signal obtained by reproducing the 8T signal became higher and that in the case where the value of x was about 0.5 (50 atomic %), and both the C/N ratio of the signal obtained by reproducing the 2T signal and the C/N ratio of the signal obtained by reproducing the 8T signal became maximum.

Working Example 6

In the same manner as in Working Example 5, a random signal including a 2T signal to an 8T signal in the 1,7 RLL Modulation Code was recorded in each of the optical recording medium samples #5-1 to #5-5 by setting the recording power of the laser beam to the optimum recording power. Then, the thus recorded random signal was reproduced from each of the optical recording medium samples #5-1 to #5-5 and clock jitter of the reproduced signal was measured.

Figure 13:
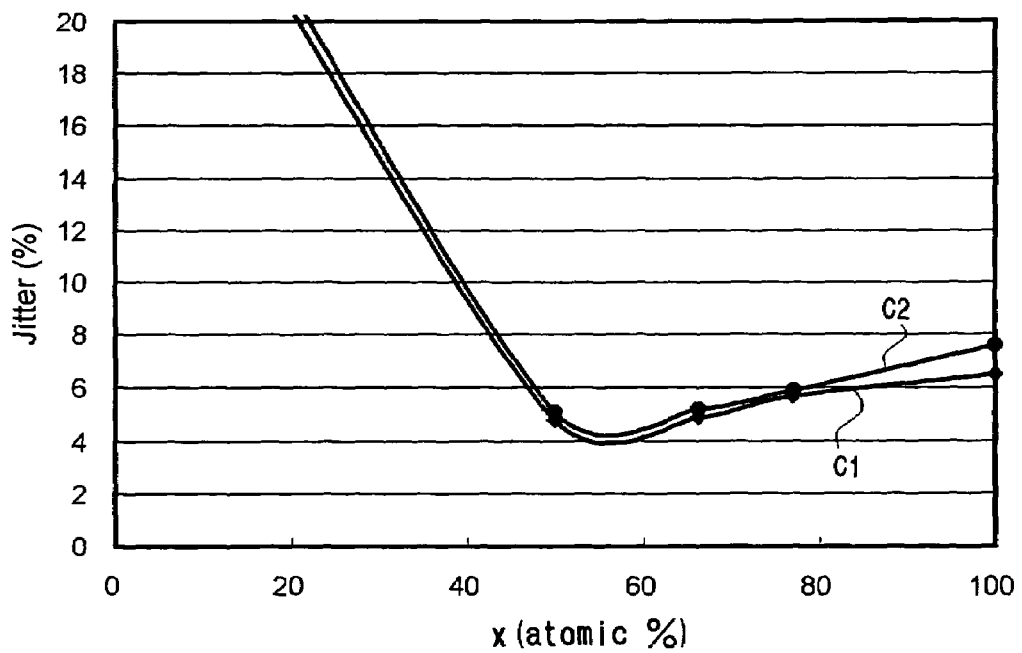
FIG. 13 is a graph showing how single jitter and cross jitter of a signal reproduced from each of optical recording medium samples #5-1 to #5-5 varied with a value of x.

The results of the measurement are shown in FIG. 13.

In FIG. 13, the curve C1 shows clock jitter (single jitter) of a reproduced signal obtained from a track located between tracks in which no data were reproduced and the curve C2 shows clock jitter (cross jitter) of a reproduced signal obtained from a track located between tracks in which data were recorded.

As shown in FIG. 13, it was found that in the case where the value of x in the composition formula: $Ti_xAl_{1-x}$ was less than 0.3 (30 atomic %), both single jitter and cross jitter were extremely high and that in the case where the value of x in the composition formula: $Ti_xAl_{1-x}$ was equal to or more than 0.4 (40 atomic %) and equal to or less than 0.6 (60 atomic %), the difference between single jitter and cross jitter was small. It was further found that in the case where the value of x in the composition formula: $Ti_xAl_{1-x}$ was about 0.5, the difference between single jitter and cross jitter was extremely small.

Therefore, it was found that in order to improve cross-talk characteristics of an optical recording medium, it was preferable to determine the composition of the alloy contained in the recording layer so that the value of x in the composition formula: $Ti_xAl_{1-x}$ was 0.4 (40 atomic %) to 0.6 (60 atomic %) and that it was particularly preferable to determine the composition of the alloy contained in the recording layer so that the value of x was about 0.5.

Working Example 7

An optical recording medium sample #7-1 was fabricated in the same manner as in Working Example 1 except that a recording layer containing an alloy represented by a composition formula: $(Ti_{0.5}Al_{0.5})_ySi_{1-y}$ was formed.

The composition of the alloy contained in the recording layer was determined so that the value of y in the composition formula: $(Ti_{0.5}Al_{0.5})_ySi_{1-y}$ was equal to 0.67 (67 atomic %).

Further, optical recording medium samples #7-2 and #7-3 were fabricated in the same way as the optical recording medium sample #7-1 except that the value of y in the composition formula: $(Ti_{0.5}Si_{0.5})_yAl_{1-y}$ was stepwise increased up to 1 (100 atomic %) to form recording layers.

Then, each of the optical recording medium samples #7-1 to #7-3 was set in the above mentioned optical recording medium evaluation apparatus and in the same manner as in Working Example 1, a random signal including a 2T signal to an 8T signal in the 1,7 RLL Modulation Code was recorded in each of the optical recording medium samples #7-1 to #7-3 using a laser beam whose recording power was set to 7.0 mW. Then, the thus recorded random signal was reproduced from each of the optical recording medium samples #7-1 to #7-3 and clock jitter of the reproduced signal was measured.

Further, similarly to the above, a random signal was recorded in each of the optical recording medium samples #7-1 to #7-3 while increasing the recording power of the laser beam in increments of 0.2 mW up to 10.0 mW, thereby reproducing the random signal from each sample and measuring clock jitter of the reproduced signal similarly to the above.

The lowest clock jitter was determined from among the thus measured clock jitters and the recording power at which the clock jitter of the reproduced signal was lowest was determined as an optimum recording power of the laser beam.

Further, a 2T signal was recorded in each of the optical recording medium samples #7-1 to #7-3 using a laser beam whose recording power was set to the optimum recording power in the same manner as that of recording the random signal in the recording layer of each sample.

Then, in the same manner as that of reproducing the random signal from the recording layer of each sample, the 2T signal recorded using a laser whose power was set to the optimum recording power was reproduced from each of the optical recording medium samples #7-1 to #7-3, thereby measuring the C/N ratio of the reproduced signal.

Figure 14:
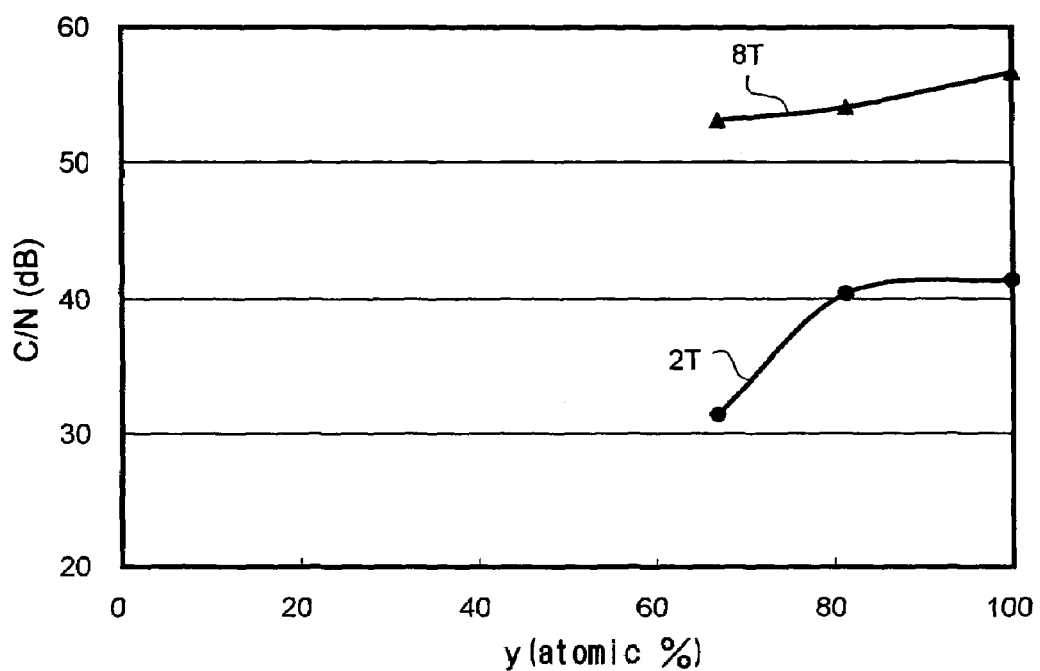
FIG. 14 is a graph showing how a C/N ratio of a signal reproduced from each of optical recording medium samples #7-1 to #7-3 varied with a value of y.

The results of the measurement are shown in FIG. 14.

Further, each of the optical recording medium samples #7-1 to #7-3 was set in the above mentioned optical recording medium evaluation apparatus and an 8T signal in the 1,7 RLL Modulation Code was recorded in each of the optical recording medium samples #7-1 to #7-3 using a laser beam whose recording power was set to the optimum recording power in the similar manner as that of recording the random signal in the recording layer of each sample.

Then, in the same manner as that of reproducing the random signal from the recording layer of each sample, the 8T signal recorded using a laser whose power was set to the optimum recording power was reproduced from each of the optical recording medium samples #7-1 to #7-3, thereby measuring the C/N ratio of the reproduced signal.

The results of the measurement are shown in FIG. 14.

As shown in FIG. 14, it was found that in the case where the value of y in the composition formula: $(Ti_{0.5}Al_{0.5})_y Si_{1-y}$ was 0.75 (75 atomic %) to 1 (100 atomic %), both the C/N ratio of the signal obtained by reproducing the 2T signal and the C/N ratio of the signal obtained by reproducing the 8T signal decreased slightly as the value of y decreased but that the C/N ratio of the signal obtained by reproducing the 2T signal was substantially equal to or higher than 40 dB and the C/N ratio of the signal obtained by reproducing the 8T signal was equal to or higher than 50 dB.

On the other hand, it was found that in the case where the value of y in the composition formula: $(Ti_{0.5}Al_{0.5})_y Si_{1-y}$ was smaller than 0.75 (75 atomic %) to 1 (100 atomic %), both the C/N ratio of the signal obtained by reproducing the 2T signal and the C/N ratio of the signal obtained by reproducing the 8T signal decreased as the value of y decreased,.

Therefore, it was found that in the case where the value of y in the composition formula: $(Ti_{0.5}Al_{0.5})_y Si_{1-y}$ was equal to or larger than 0.75 (75 atomic %), the C/N ratio of a reproduced signal was not much influenced by any Si contained in the alloy.

Working Example 8

In the same manner as in Working Example 7, a random signal including a 2T signal to an 8T signal in the 1,7 RLL Modulation Code was recorded in each of the optical recording medium samples #7-1 to #7-3 by setting the recording power of the laser beam to the optimum recording power. Then, the thus recorded random signal was reproduced from each of the optical recording medium samples #7-1 to #7-3 and clock jitter of the reproduced signal was measured.

Figure 15:
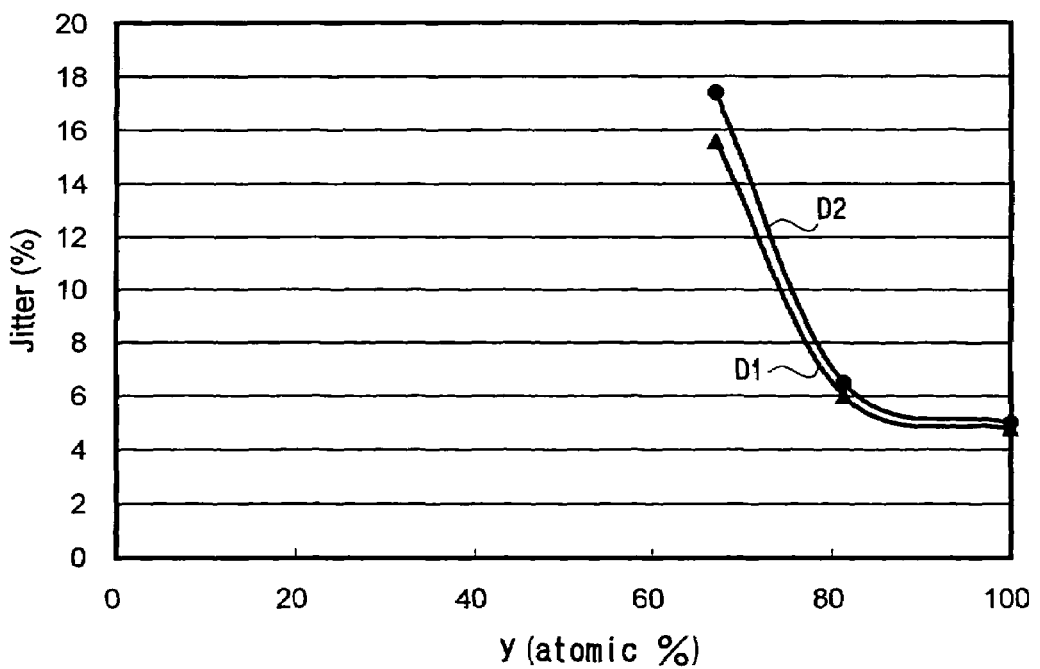
FIG. 15 is a graph showing how single jitter and cross jitter of a signal reproduced from each of optical recording medium samples #7-1 to #7-3 varied with a value of y.

The results of the measurement are shown in FIG. 15.

In FIG. 15, the curve D1 shows clock jitter (single jitter) of a reproduced signal obtained from a track located between tracks in which no data were reproduced and the curve D2 shows clock jitter (cross jitter) of a reproduced signal obtained from a track located between tracks in which data were recorded.

As shown in FIG. 15, it was found that in the case where the value of y in the composition formula: $(Ti_{0.5}Al_{0.5})_y Si_{1-y}$ was 0.75 (75 atomic %) to 1 (100 atomic %), decreasing value of y was accompanied by slight increase in both single jitter and cross jitter but no marked increase in single jitter and cross jitter was observed.

To the contrary, it was found that in the case where the value of y in the composition formula: $(Ti_{0.5}Al_{0.5})_y Si_{1-y}$ was smaller than 0.75 (75 atomic %) to 1 (100 atomic %), decreasing value of y was accompanied by an abrupt increase in both single jitter and cross jitter.

Therefore, it was found that in the case where the value of y in the composition formula: $(Ti_{0.5}Al_{0.5})_y Si_{1-y}$ was equal to or larger than 0.75 (75 atomic %), single jitter and cross jitter of a reproduced signal were not much influenced by any Si contained in the alloy.

The present invention has thus been shown and described with reference to specific embodiments and working examples. However, it should be noted that the present invention is in no way limited to the details of the described arrangements but changes and modifications may be made without departing from the scope of the appended claims.

For example, in the optical recording medium 10 shown in FIGS. 1 and 2, although the recording layer 14 is sandwiched by the second dielectric layer 23 and the first dielectric layer 15, only one of the second dielectric layer 23 and the first dielectric layer 15 may be formed to be adjacent to the recording layer 14. Similarly, in the optical recording medium 30 shown in FIG. 7, each of the L0 information recording layer 40 and the L1 information recording layer 50 may include a single dielectric layer.

Moreover, although the optical recording medium 10 shown in FIGS. 1 and 2 includes the reflective layer 12 on the support substrate 11, in the case where the difference in reflection coefficients between a region of the recording layer 14 where a record mark is formed and a blank region is great, the reflective layer 12 may be omitted.

Further, in the above described embodiments, although each of the reflective layer 12, the reflective layer 41 and the reflective layer 51 is constituted as a single layer, each of the reflective layer 12, the reflective layer 41 and the reflective layer 51may have a multi-layered structure.

Furthermore, in the embodiment shown in FIG. 7, the L1 information recording layer 50 includes a reflective layer 51, but since a laser beam L passes through the L1 information recording layer 50 when the laser beam L is projected onto the L0 information recording layer 40, the L1 information recording layer 50 may be provided with no reflective layer or an extremely thin reflective layer in order to increase the light transmittance of the L1 information recording layer 50.

Moreover, although the optical recording medium 10 includes the single recording layer 14 as an information recording layer in the embodiment shown in FIGS. 1 and 2 and the optical recording medium 30 includes the L0 information recording layer 40 and the L1 information recording layer 50 in the embodiment shown in FIG. 7, an optical recording medium may include three or more information recording layer.

Further, the optical recording medium 10 includes the light transmission layer 16 and is constituted so that a laser beam L is projected onto the recording layer 14 via the light transmission layer 16 in the embodiment shown in FIGS. 1 and 2, and the optical recording medium 30 includes the light transmission layer 33 and is constituted so that a laser beam L is projected onto the L1 information recording layer 50 or the L0 information recording layer 40 via the light transmission layer 33 in the embodiment shown in FIG. 7. However, the present invention is not limited to optical recording media having such configurations and the optical recording medium may include a substrate formed of a light transmittable material and be constituted so that a laser beam L is projected onto the recording layer 14, or the L1 information recording layer 50 or the L0 information recording layer 40 via the substrate.

According to the present invention, it is possible to provide an optical recording medium including a recording layer formed of materials which apply minimal load to the global environment.

Further, according to the present invention, it is possible to provide a method for manufacturing an optical recording medium including a recording layer formed of materials which apply minimal load to the global environment.

Furthermore, according to the present invention, it is possible to provide a target used for a sputtering process, which can form a recording layer of an optical recording medium of materials that place minimal load on the global environment.

What is claimed is:

1. An optical recording medium comprising a recording layer containing an alloy represented by a general formula: $(Ti_x M1_x)_y M2_y$, where element M1 is Si or Al, element M2 is an element different from the element M1, x is equal to or larger than 0.3 and equal to or smaller than 0.8, and y is equal to or larger than 0.75 and equal to or smaller than 1.

2. An optical recording medium in accordance with claim 1, wherein the element M2 is selected from the group consisting of Si, Al and Fe.

3. An optical recording medium in accordance with claim 1, wherein x is equal to or larger than 0.4 and equal to or smaller than 0.6.

4. An optical recording medium in accordance with claim 2, wherein x is equal to or larger than 0.4 and equal to or smaller than 0.6.

5. An optical recording medium in accordance with claim 1, which further comprises a dielectric layer on at least one side of the recording layer.

6. An optical recording medium in accordance with claim 2, which further comprises a dielectric layer on at least one side of the recording layer.

7. An optical recording medium in accordance with claim 3, which further comprises a dielectric layer on at least one side of the recording layer.

8. An optical recording medium in accordance with claim 1, which further comprises dielectric layers on opposite sides of the recording layer.

9. An optical recording medium in accordance with claim 2, which further comprises dielectric layers on opposite sides of the recording layer.

10. An optical recording medium in accordance with claim 3, which further comprises dielectric layers on opposite sides of the recording layer.

11. A method for manufacturing an optical recording medium comprising of a step of forming a recording layer of an optical recording medium by a sputtering process using a target that contains an alloy represented by a general formula: $(Ti_xM1_{x'})_{y'}M2_{y'}$, where element M1 is Si or Al, element M2 is an element different from the element M1, x' is equal to or larger than 0.37 and equal to or smaller than 0.85 and y' is equal to or larger than 0.75 and equal to or smaller than 1.

12. A method for manufacturing an optical recording medium in accordance with claim 11, wherein the element M2 is selected from the group consisting of Si, Al and Fe.

13. A method for manufacturing an optical recording medium in accordance with claim 11, wherein x is equal to or larger than 0.4 and equal to or smaller than 0.6.

14. A method for manufacturing an optical recording medium in accordance with claim 12, wherein x is equal to or larger than 0.4 and equal to or smaller than 0.6.

15. A target used for a sputtering process that contains an alloy represented by a general formula: $(Ti_xM1_{x'})_yM2_{1-y'}$, where element M1 is Si or Al, element M2 is an element different from the element M1, x' is equal to or larger than 0.37 and equal to or smaller than 0.85 and y' is equal to or larger than 0.75 and equal to or smaller than 1.

16. A target for a sputtering process in accordance with claim 15, wherein the element M2 is selected from the group consisting of Si, Al and Fe.

17. A target for a sputtering process in accordance with claim 15, wherein x is equal to or larger than 0.4 and equal to or smaller than 0.6.

18. A target for a sputtering process in accordance with claim 16, wherein x is equal to or larger than 0.4 and equal to or smaller than 0.6.

* * * * *